(12) United States Patent
Voronin et al.

(10) Patent No.: US 10,777,385 B2
(45) Date of Patent: Sep. 15, 2020

(54) METHOD FOR RF POWER DISTRIBUTION IN A MULTI-ZONE ELECTRODE ARRAY

(71) Applicant: Tokyo Electron Limited, Minato-ku, Tokyo (JP)

(72) Inventors: Sergey Voronin, Glenmont, NY (US); Alok Ranjan, Tomiya (JP)

(73) Assignee: Tokyo Electron Limited, Tokyo (JP)

( * ) Notice: Subject to any disclaimer, the term of this patent is extended or adjusted under 35 U.S.C. 154(b) by 185 days.

(21) Appl. No.: 15/647,718

(22) Filed: Jul. 12, 2017

(65) Prior Publication Data
US 2018/0019102 A1    Jan. 18, 2018

Related U.S. Application Data

(60) Provisional application No. 62/362,248, filed on Jul. 14, 2016.

(51) Int. Cl.
*H01J 37/32* (2006.01)
*C23C 16/509* (2006.01)

(52) U.S. Cl.
CPC ...... *H01J 37/32082* (2013.01); *C23C 16/509* (2013.01); *C23C 16/5093* (2013.01); *H01J 37/3244* (2013.01)

(58) Field of Classification Search
CPC ............... C23C 16/5093; C23C 16/509; H01J 37/3244; H01J 37/32082
See application file for complete search history.

(56) References Cited

U.S. PATENT DOCUMENTS

| 2003/0137251 A1* | 7/2003 | Mitrovic ........... H01J 37/32009 315/111.21 |
| 2005/0039682 A1* | 2/2005 | Dhindsa ............ H01J 37/32082 118/723 E |
| 2010/0315064 A1 | 12/2010 | Kuthi et al. |
| 2011/0096461 A1 | 4/2011 | Yoshikawa et al. |
| 2012/0279659 A1 | 11/2012 | Dhindsa |

(Continued)

FOREIGN PATENT DOCUMENTS

| JP | 07086238 A | * | 6/1993 |
| JP | 2000058296 A | * | 2/2000 |

(Continued)

OTHER PUBLICATIONS

International Searching Authority, International Search Report and Written Opinion issued in Application No. PCT/US2017/041703 dated Oct. 24, 2017, 12 pp.

(Continued)

*Primary Examiner* — Yuechuan Yu
(74) *Attorney, Agent, or Firm* — Wood Herron & Evans LLP

(57) ABSTRACT

Embodiments of systems and methods for RF power distribution in a multi-zone electrode array are described. A system may include a plasma source configured to generate a plasma field. Also, the system may include an RF power source coupled to the plasma source and configured to supply RF power to the plasma source. The system may also include a source controller coupled to the RF power source and configured to control modulation of the RF power supplied to the plasma source to enhance uniformity of a plasma field generated by the plasma source.

14 Claims, 6 Drawing Sheets

(56) References Cited

U.S. PATENT DOCUMENTS

2014/0231015 A1  8/2014  Kobayashi et al.
2015/0364354 A1  12/2015  Tantiwong et al.

FOREIGN PATENT DOCUMENTS

TW    200831916 A    8/2008
TW    201119519 A    6/2011

OTHER PUBLICATIONS

International Searching Authority, International Preliminary Report on Patentability issued in International Application No. PCT/US2017/041703 dated Jan. 24, 2019 (12 pages).
Taiwan Patent Office, Notifcation of Examination Opinions issued in corresponding TW Application No. 106123403 dated Oct. 18, 2018, 15 pp. including partial English translation.

\* cited by examiner

METHOD FOR RF POWER DISTRIBUTION IN A MULTI-ZONE ELECTRODE ARRAY

CROSS-REFERENCE TO RELATED APPLICATIONS

This application is related to and claims priority to U.S. Provisional Application No. 62/362,248, filed Jul. 14, 2016, the entire contents of which are herein incorporated by reference.

BACKGROUND OF THE INVENTION

Field of Invention

The present invention relates to systems and methods for substrate processing, and more particularly to a method and system for Radio Frequency (RF) power distribution in a multi-zone electrode array.

Description Of Related Art

Plasma sources are used in various semiconductor device manufacturing processes, such as dry plasma etch processes. A plasma etch process is used to remove or etch material along fine lines or within vias or contact holes patterned on a semiconductor substrate. The plasma etch process generally involves positioning a semiconductor substrate with an overlaying patterned, protective layer, for example a photoresist layer, into a processing chamber.

Once the substrate is positioned within the chamber, it is etched by introducing an ionizable, dissociative gas mixture into the chamber at a pre-specified flow rate, while adjusting a vacuum pump to achieve a processing pressure. Then, plasma is formed when a portion of the gas species is ionized by collisions with energetic electrons. The heated electrons dissociate some of the gas species in the gas mixture to create reactant species suitable for the exposed surface-etch chemistry. Once the plasma is formed, any exposed surfaces of the substrate are etched by the plasma at a rate that varies as a function of plasma density, average electron energy, and other factors.

Conventionally, various techniques have been implemented for exciting a gas into plasma for the treatment of a substrate during semiconductor device fabrication, as described above. In particular, "parallel plate" capacitively coupled plasma (CCP) processing systems, or inductively coupled plasma (ICP) processing systems have been used commonly for plasma excitation.

Pulsed RF plasmas are commonly used for a range of processing applications. In general CCP plasma tools have two electrodes, powered at different RF frequencies. A high frequency source controls the ion flux of the plasma source, and a low frequency source controls the ion energy.

As design requirements for target feature sizes decreases, particularly beyond the 10 nm technological node, etch process uniformity requirements increase dramatically. Prior CCP processing systems may not be capable of meeting such uniformity requirements because of variation in plasma densities, including ion energy and ion flux.

SUMMARY OF THE INVENTION

Embodiments of systems and methods for RF power distribution in a multi-zone electrode array are described. A system may include a plasma source configured to generate a plasma field. Also, the system may include an RF power source coupled to the plasma source and configured to supply RF power to the plasma source. The system may also include a source controller coupled to the RF power source and configured to control modulation of the RF power supplied to the plasma source to enhance uniformity of a plasma field generated by the plasma source.

In an embodiment, a method includes providing a plasma source configured to generate a plasma field, the plasma source having a first electrode assembly having a plurality of source electrodes and a second electrode assembly having a plurality of ring-shaped source electrodes. The method may also include supplying High Frequency (HF) Radio Frequency (RF) power to the first electrode assembly and Low Frequency (LF) RF power to the second electrode assembly with a RF power source. Additionally, the method may include selectably applying RF power to the each of the plurality of source electrodes in the first electrode assembly independently with a first multiplexer coupled to the first electrode assembly. Also, the method may include selectably applying RF power to the each of the plurality of source electrodes in the second electrode assembly independently with a second multiplexer coupled to the second electrode assembly. The method may also include controlling modulation of the RF power supplied to the plasma source to enhance uniformity of a plasma field generated by the plasma source with a source controller coupled to the first multiplexer and to the second multiplexer.

BRIEF DESCRIPTION OF THE DRAWINGS

The accompanying drawings, which are incorporated in and constitute a part of this specification, illustrate embodiments of the invention and, together with the general description of the invention given above, and the detailed description given below, serve to describe the invention.

DETAILED DESCRIPTION OF EMBODIMENTS OF THE INVENTION

Figure 1:
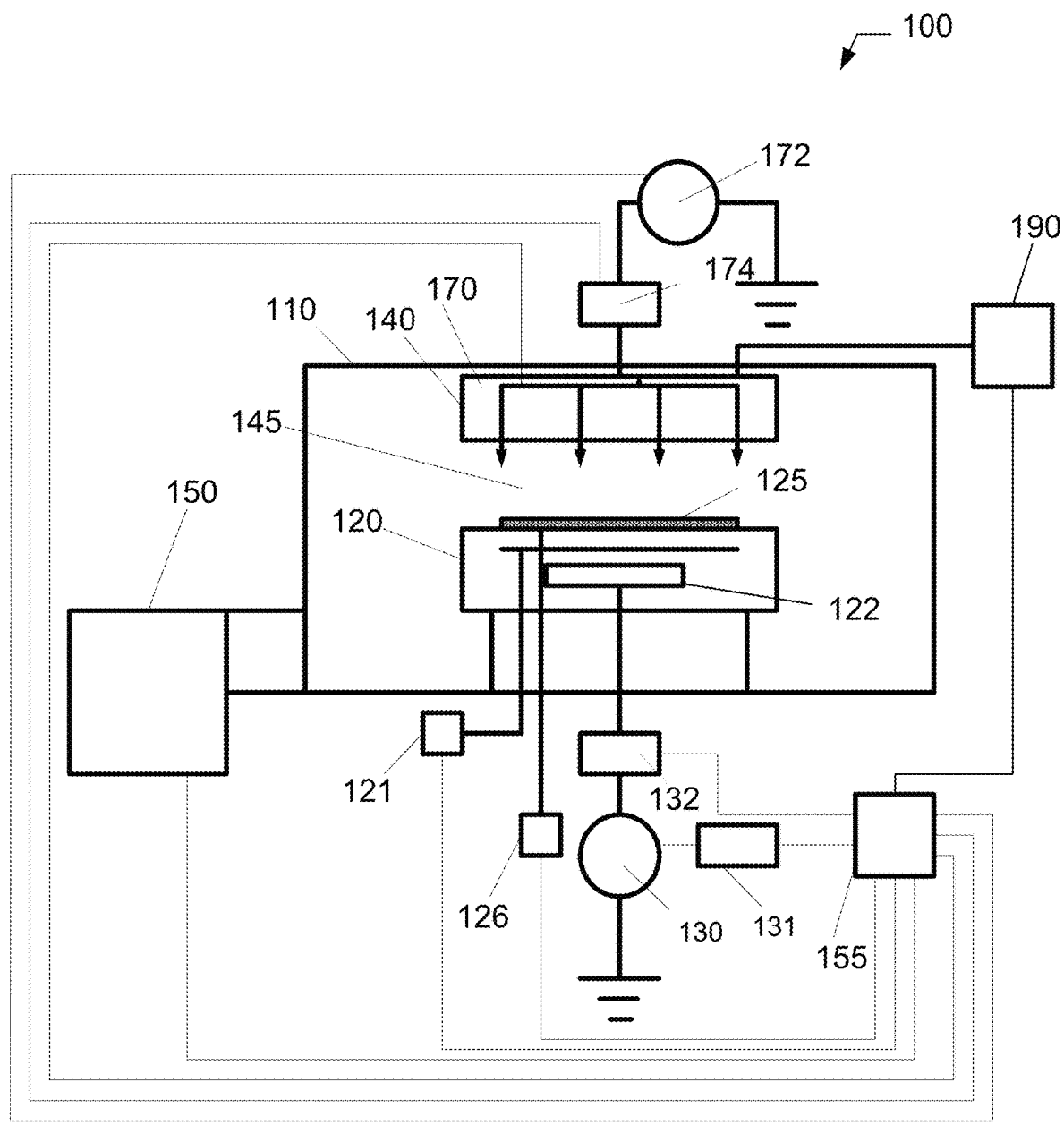
FIG. 1 is a schematic block diagram illustrating one embodiment of a system for plasma processing.

Methods and systems for RF power distribution in a multi-zone electrode array are presented. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale. In referencing the figures, like numerals refer to like parts throughout.

Reference throughout this specification to "one embodiment" or "an embodiment" or variation thereof means that a particular feature, structure, material, or characteristic described in connection with the embodiment is included in at least one embodiment of the invention, but does not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Additionally, it is to be understood that "a" or "an" may mean "one or more" unless explicitly stated otherwise.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

As used herein, the term "substrate" means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Referring now to the drawings, where like reference numerals designate identical or corresponding parts throughout the several views.

FIG. 1 is an embodiment of a system 100 for performing an etch and post heat treatment. In a further embodiment, as described with reference to FIG. 2, the system 100 may be further configured for RF power distribution in a multi-zone electrode array. An etch and post heat treatment system 100 configured to perform the above identified process conditions is depicted in FIG. 1 comprising a processing chamber 110, substrate holder 120, upon which a substrate 125 to be processed is affixed, and vacuum pumping system 150. Substrate 125 can be a semiconductor substrate, a wafer, a flat panel display, or a liquid crystal display. Processing chamber 110 can be configured to facilitate etching the processing region 145 in the vicinity of a surface of substrate 125. An ionizable gas or mixture of process gases is introduced via a gas distribution system 140. For a given flow of process gas, the process pressure is adjusted using the vacuum pumping system 150.

Substrate 125 can be affixed to the substrate holder 120 via a clamping system (not shown), such as a mechanical clamping system or an electrical clamping system (e.g., an electrostatic clamping system). Furthermore, substrate holder 120 can include a heating system (not shown) or a cooling system (not shown) that is configured to adjust and/or control the temperature of substrate holder 120 and substrate 125. The heating system or cooling system may comprise a re-circulating flow of heat transfer fluid that receives heat from substrate holder 120 and transfers heat to a heat exchanger system (not shown) when cooling, or transfers heat from the heat exchanger system to substrate holder 120 when heating. In other embodiments, heating/cooling elements, such as resistive heating elements, or thermo-electric heaters/coolers can be included in the substrate holder 120, as well as the chamber wall of the processing chamber 110 and any other component within the processing system 100.

Additionally, a heat transfer gas can be delivered to the backside of substrate 125 via a backside gas supply system 126 in order to improve the gas-gap thermal conductance between substrate 125 and substrate holder 120. Such a system can be utilized when temperature control of the substrate is required at elevated or reduced temperatures. For example, the backside gas supply system can comprise a two-zone gas distribution system, wherein the helium gas-gap pressure can be independently varied between the center and the edge of substrate 125.

In the embodiment shown in FIG. 1, substrate holder 120 can comprise an electrode 122 through which RF power is coupled to the processing region 145. For example, substrate holder 120 can be electrically biased at a RF voltage via the transmission of RF power from a RF generator 130 through an optional impedance match network 132 to substrate holder 120. The RF electrical bias can serve to heat electrons to form and maintain plasma. In this configuration, the system 100 can operate as a reactive ion etch (RIE) reactor, wherein the chamber and an upper gas injection electrode serve as ground surfaces.

Furthermore, the electrical bias of electrode 122 at a RF voltage may be pulsed using pulsed bias signal controller 131. The RF power output from the RF generator 130 may be pulsed between an off-state and an on-state, for example. Alternately, RF power is applied to the substrate holder electrode at multiple frequencies. Furthermore, impedance match network 132 can improve the transfer of RF power to plasma in plasma processing chamber 110 by reducing the reflected power. Match network topologies (e.g. L-type, π-type, T-type, etc.) and automatic control methods are well known to those skilled in the art.

Gas distribution system 140 may comprise a showerhead design for introducing a mixture of process gases. Alternatively, gas distribution system 140 may comprise a multi-zone showerhead design for introducing a mixture of process gases, where x is a number greater than 0, and adjusting the distribution of the mixture of process gases above substrate 125. For example, the multi-zone showerhead design may be configured to adjust the process gas flow or composition to a substantially peripheral region above substrate 125 relative to the amount of process gas flow or composition to a substantially central region above substrate 125. In such an embodiment, gases may be dispensed in a suitable combination to form a highly uniform plasma within the chamber 110.

Vacuum pumping system 150 can include a turbo-molecular vacuum pump (TMP) capable of a pumping speed up to about 8000 liters per second (and greater) and a gate valve for throttling the chamber pressure. In conventional plasma processing devices utilized for dry plasma etching, an 800 to 3000 liter per second TMP can be employed. TMPs are useful for low pressure processing, typically less than about 50 mTorr. For high pressure processing (i.e., greater than about 80 mTorr), a mechanical booster pump and dry roughing pump can be used. Furthermore, a device for monitoring chamber pressure (not shown) can be coupled to the plasma processing chamber 110.

In an embodiment, the source controller 155 can comprise a microprocessor, memory, and a digital I/O port capable of generating control voltages sufficient to communicate and activate inputs to processing system 100 as well as monitor outputs from plasma processing system 100. Moreover, source controller 155 can be coupled to and can exchange information with RF generator 130, pulsed bias signal controller 131, impedance match network 132, the gas distribution system 140, the gas supply 190, vacuum pumping system 150, as well as the substrate heating/cooling system (not shown), the backside gas supply system 126, and/or the electrostatic clamping system 128. For example, a program stored in the memory can be utilized to activate the inputs to the aforementioned components of processing system 100 according to a process recipe in order to perform a plasma assisted process, such as a plasma etch process or a post heating treatment process, on substrate 125.

In addition, the processing system 100 can further comprise an upper electrode 170 to which RF power can be coupled from RF source 172 through optional impedance match network 174. A frequency for the application of RF power to the upper electrode can range from about 0.1 MHz to about 200 MHz, in one embodiment. Alternatively, the present embodiments may be used in connection with Inductively Coupled Plasma (ICP) sources, Capacitive Coupled Plasma (CCP) sources, surface wave plasma sources configured to operate in GHz frequency ranges, Electron Cyclotron Resonance (ECR) sources configured to operate in sub-GHz to GHz ranges, and others. Additionally, a frequency for the application of power to the lower electrode can range from about 0.1 MHz to about 80 MHz. Moreover, source controller 155 is coupled to RF source 172 and impedance match network 174 in order to control the application of RF power to upper electrode 170. The design and implementation of an upper electrode is well known to those skilled in the art. The upper electrode 170 and the gas distribution system 140 can be designed within the same chamber assembly, as shown. Alternatively, upper electrode 170 may comprise a multi-zone electrode design for adjusting the RF power distribution coupled to plasma above substrate 125. For example, the upper electrode 170 may be segmented into a center electrode and an edge electrode.

Depending on the applications, additional devices such as sensors or metrology devices can be coupled to the processing chamber 110 and to the source controller 155 to collect real time data and use such real time data to concurrently control two or more selected integration operating variables in two or more steps involving deposition processes, RIE processes, pull processes, profile reformation processes, heating treatment processes and/or pattern transfer processes of the integration scheme. Furthermore, the same data can be used to ensure integration targets including completion of post heat treatment, patterning uniformity (uniformity), pull-down of structures (pulldown), slimming of structures (slimming), aspect ratio of structures (aspect ratio), line width roughness, substrate throughput, cost of ownership, and the like are achieved.

By modulating the applied power, typically through variation of the pulse frequency and duty ratio, it is possible to obtain markedly different plasma properties from those produced in continuous wave (CW). Consequently, RF power modulation of the electrodes can provide control over time-averaged ion flux and the ion energy.

Figure 2:
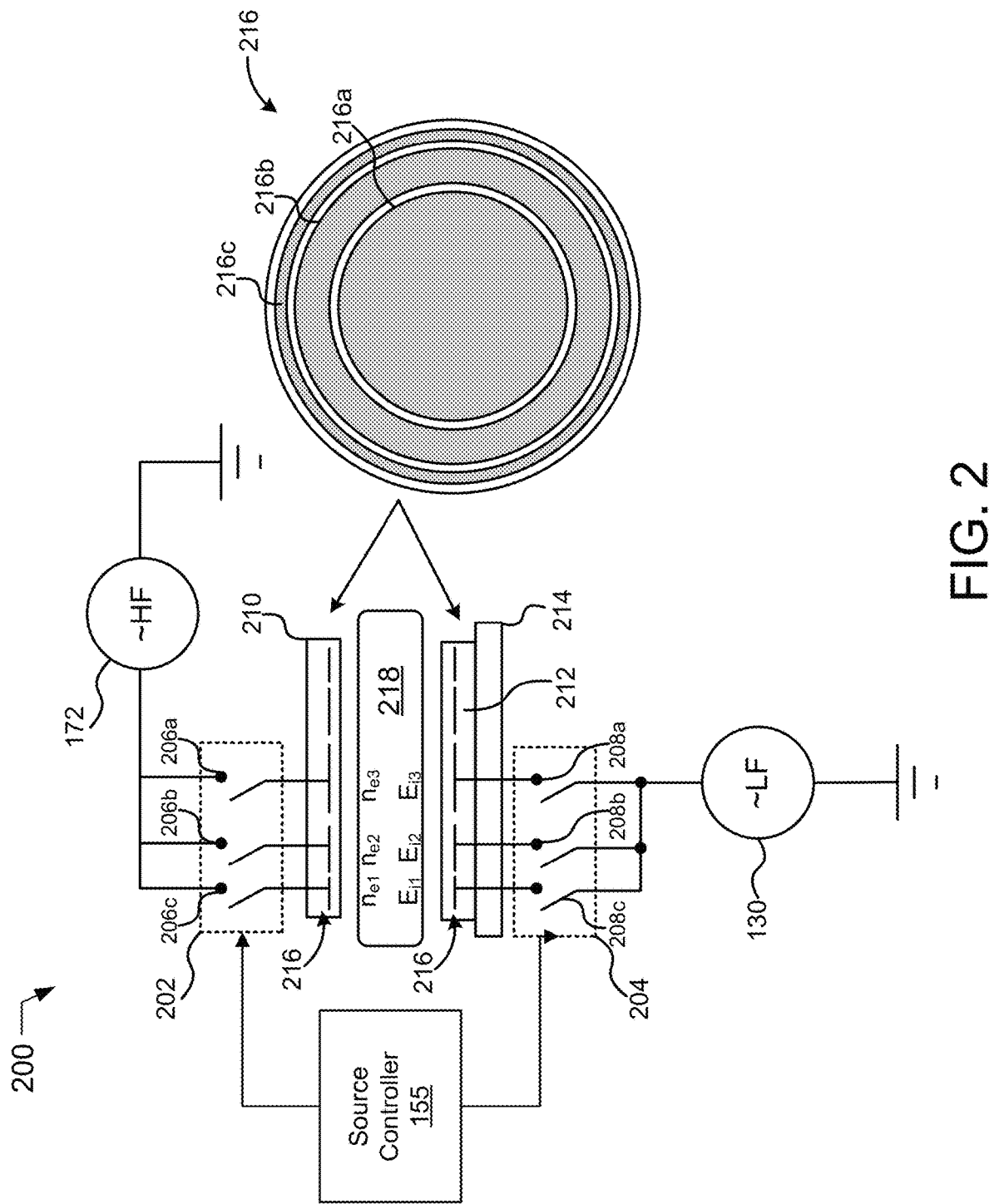
FIG. 2 is a schematic diagram illustrating one embodiment of a system for RF power distribution in a multi-zone electrode array.

FIG. 2 is a schematic diagram illustrating one embodiment of a system 200 for RF power distribution in a multi-zone electrode array. In an embodiment, the system 200 includes the source controller 155, the high frequency RF source 172, and the low frequency RF source 135. In an embodiment, the low frequency RF source 135 may supply RF power at a frequency between 1 MHz and 50 MHz, and the high frequency RF source 172 may supply RF power at a frequency between 1 MHz and 200 MHz. Additionally, the system 200 may include a first multiplexer 202 coupled to the high frequency RF source 172 and a second multiplexer 204 coupled to the low frequency RF source 135. In an embodiment, the high frequency RF source 172 and the low frequency RF source 135 may include a plurality of RF power source units configured to provide mixed frequencies to the first electrode assembly 210 and to the second electrode assembly 212 respectively. Further embodiments may include dual-frequency or multi-frequency RF generators.

Additionally, a first electrode assembly 210 may be coupled to the first multiplexer 202 and a second electrode assembly 212 may be coupled to the second multiplexer 204. Various alternative embodiments of a first electrode assembly 210 may be included, such as an inductively coupled plasma (ICP) source, or the like. One of ordinary skill will recognize that the frequency ranges mentioned above may vary depending upon the implementation.

In an embodiment, each of the first electrode assembly 210 and the second electrode assembly 212 may include a plasma source 216, which as defined here, refers to a multi-zone electrode array comprising a first electrode 216a, a second electrode 216b, and a third electrode 216c. In an embodiment, the surface area of each electrode is substantially the same, and designed to keep the same plasma impedance when the RF power is connected to any of the contact pads (not shown). One of ordinary skill will recognize that any number of electrodes may be included in the plasma source 216. Indeed, the size and number of electrodes may vary depending upon whether the plasma source 216 is used in the first electrode assembly 210 or the second electrode assembly 212. In some embodiments, there may be anywhere from 1 to 100 electrodes. In the depicted embodiment, the electrodes 216a, 216b and 216c are disposed concentrically. One of ordinary skill will recognize a variety of alternative electrode counts and arrangements, including arrays of patch electrodes, strip electrodes, etc.

In an embodiment, the first multiplexer 202 may include multiple RF switches 206a, 206b and 206c, one for each electrode 216a, 216b and 216c. Alternatively, a single multi-port RF switch may be used. One of ordinary skill will recognize a variety of RF switches that may be used according to the present embodiments, including for example, single-pole-double-throw switches, multiport or single-pole multiple throw switches, transfer or double-pole-double-throw switches, etc.

In an embodiment, the source controller 155 may provide control signals to the first multiplexer 202 and the second multiplexer 204 for operation of at least one of the switches 206a, 206b, 206c, 208a, 208b, and 208c according to a process for enhancing uniformity of the plasma field 218. In particular, the source controller 155 may operate according to the processes described in relation to FIG. 5. In such an embodiment, the source controller 155 may operate the RF switches according to a duty cycle configured to enhance either the ion density $n_{e1}$, $n_{e2}$, $n_{e3}$, or the ion energy $E_{i1}$, $E_{i2}$, $E_{i3}$ in various regions of the plasma field 218.

In one embodiment, each of the switches 206a, 206b, 206c, 208a, 208b, and 208c may be operated in series, such that the electrodes 216a, 216b, and 216c in first electrode assembly 210 and the electrodes 216a, 216b, and 216c in the second electrode assembly 212 receive RF charge in series. In another embodiment, two or more of the switches 206a, 206b, 206c, 208a, 208b, and 208c may be operated in parallel, such that two or more of the electrodes 216a, 216b, and 216c in the second electrode assembly 212 receive RF charge in parallel. Indeed, one of ordinary skill will recognize that various patterns may be employed. For example, electrodes 216a and 216c in the first electrode assembly 210 may be operated in parallel with electrode 216b in the second electrode assembly 212, and the like. The various patterns may be used to achieve improved consistency, or to reach various processing goals, depending upon the features to be formed on or in the substrate 125.

Figure 3:
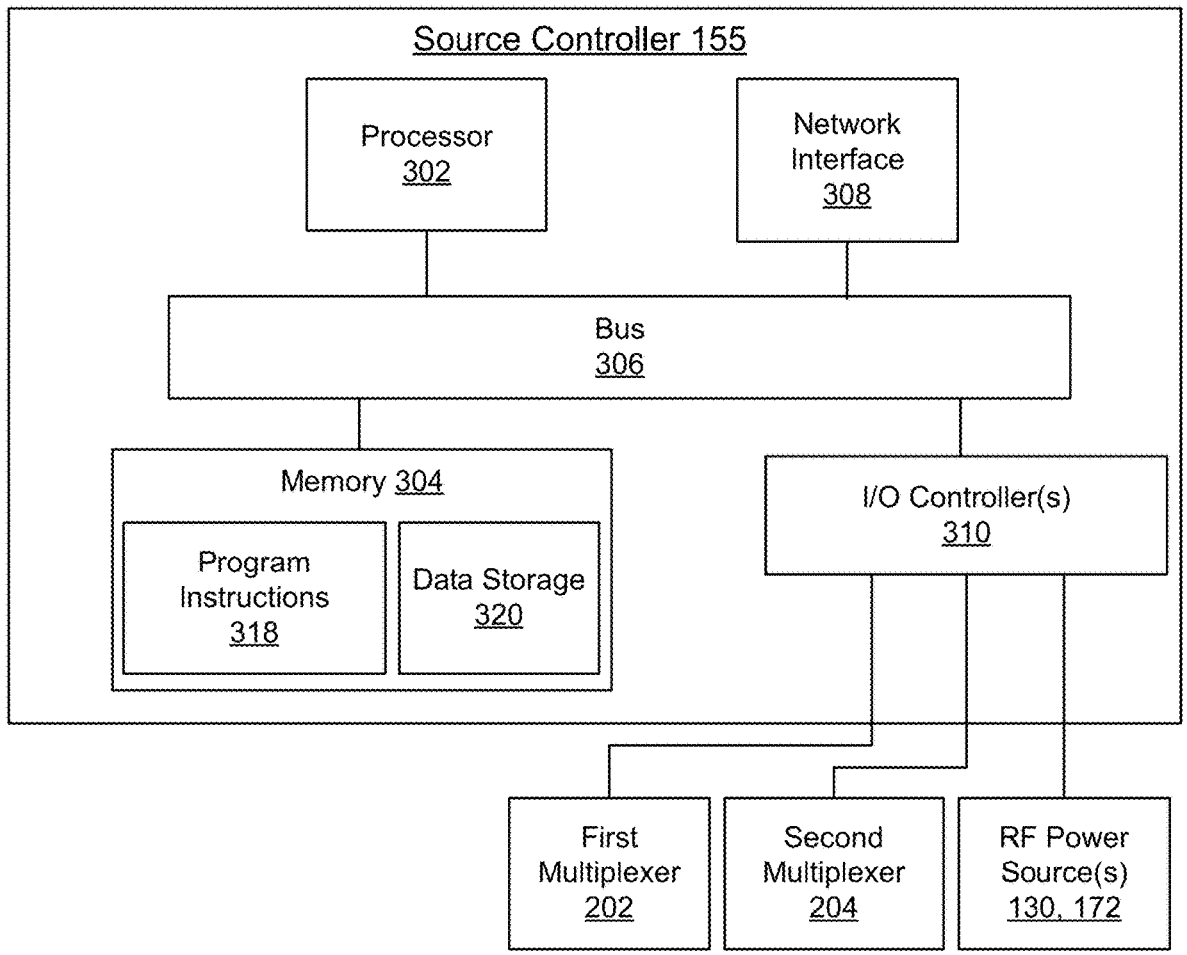
FIG. 3 is a schematic block diagram illustrating one embodiment of an apparatus for RF power distribution in a multi-zone electrode array.

FIG. 3 is a schematic block diagram illustrating one embodiment of an apparatus for RF power distribution in a multi-zone electrode array. In an embodiment, the apparatus comprises a source controller 155. The source controller 155 may include a processor 302. Other suitable embodiments of a processor 302 may include a Programmable Logic Controller (PLC), a microprocessor, a programmable gate array, etc. In the embodiment the processor 302 may be coupled to a bus 306 for carrying data and program instructions 318 between the processor 302 and a memory device 304. The memory device 304 may store data in a data storage section 320 and also program instructions 318 for carrying out operations, including generating signals for controlling the first multiplexer 202 and the second multiplexer 204.

Additionally, the bus 306 may be coupled to a network interface 308 for receiving updated program instructions or data from a remote network device (not shown). Also, the bus 306 may be coupled to an I/O controller 310 for interfacing with the first multiplexer 202, the second multiplexer 204, and the RF power sources or RF sources 172 and 130 as shown in FIG. 1.

Figure 4:
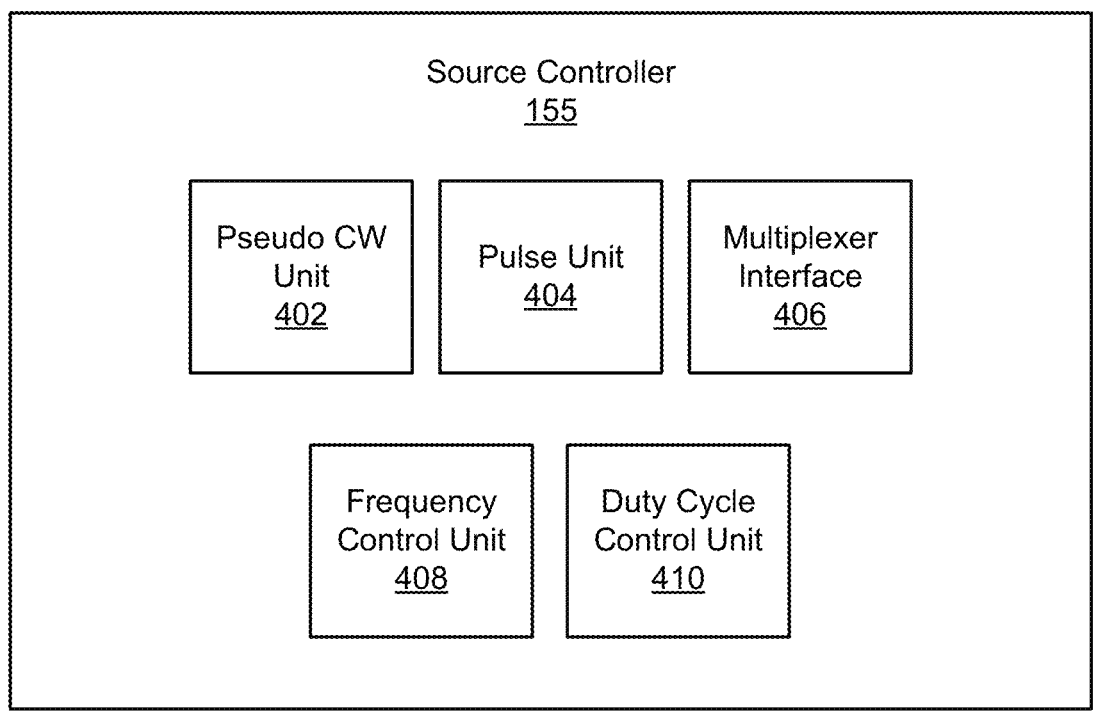
FIG. 4 is a schematic block diagram illustrating one embodiment of an apparatus for RF power distribution in a multi-zone electrode array.

In a further embodiment, the source controller 155 may include one or more software defined modules or units, as shown in FIG. 4. For example, the source controller 155 may include a pseudo CW unit 402, a pulse unit 404, a multiplexer interface 406, a frequency control unit 408, and a duty cycle control unit 410. One of ordinary skill will recognize various alternative or additional modules which may be included in the source controller 155, such as a phase control unit, or the like.

In an embodiment, the pseudo CW unit 402 applies CW RF power to each electrode for a particular period of time in one cycle. In such an embodiment, the time-averaged power, $P_N$, applied to electrode N is:

$$P_N = (t_N/T)P_0, \quad (1)$$

where $P_0$ is the set (forwarded) RF power, and $t_N$ is the RF "on" time per cycle time T. Additionally, in such an embodiment, the local plasma density near a particular electrode 216a, 216b or 216c is a function of the time-averaged power:

$$n_N = F(P_N) = F(P_0 t_N/T) \quad (2)$$

In such an embodiment, the local duty of the ion bombardment at a given energy is $E_i$ is $t_N/T$.

In an embodiment, the pulse unit 404 applies pulsing RF to each electrode 216a, 216b and 216c for a particular period of time in one cycle. In an embodiment, the pulse duty and frequency for each electrode can be individual and independent. In such an embodiment, the time-averaged power applied to electrode N is:

$$P_N = (t_N/T)P_0 D_N, \quad (3)$$

where $D_N$ is the RF power duty over $t_N$ time. In such an embodiment, the local plasma density near a particular electrode 216a, 216b or 216c is a function of the time-averaged power:

$$n_N = F(P_N D_N) = F(P_0 D_N t_N/T). \quad (4)$$

In such an embodiment, the local duty of the ion bombardment at a given energy is $E_i$ is $D_N t_N/T$.

In an embodiment, the multiplexer interface 406 may be configured to generate switch control signals according to instructions generated by either the Pseudo CW unit 402, the pulse unit 404, or both.

In an embodiment, the frequency control unit 408 may interface with at least one of the high frequency RF source 172 or the low frequency RF source 135 to modulate a frequency applied to at least one of the electrodes 216a, 216b and 216c. In various embodiments, any frequency may be applied to at least one of the electrodes 216a, 216b and 216c, including frequencies in the range of 1 Hz to 10,000 Hz.

In an embodiment, the duty cycle control unit 410 may control a duty cycle of the RF power applied to at least one of the electrodes 216a, 216b and 216c. For example, duty cycles illustrated in FIG. 5, or similar embodiments may be defined and executed by the duty cycle control unit 410.

In a further embodiment, the RF source 172 and the RF generator 130 may be configured to generate RF power at various frequencies. Additionally, the RF source 172 and RF generator 130 may be configured to generate RF power at various amplitudes. In still further embodiments, multiple signals at different frequencies may be produced and combined in a mixed-frequency signal. Additionally, various signal waveforms may be produced. Wave forms that may be produced may vary in amplitude and/or period over time. Period changes may include phase variance or frequency variance. In an embodiment, waveform may include a saw-tooth waveform where the signal amplitude is variable over time. In still further embodiments, signal types may be combined. For example, a saw-tooth signal at a first frequency may be combined with a sinusoidal signal at a second frequency. One of ordinary skill may recognize a variety of additional signal embodiments which may be produced by the RF source 172 and/or the RF generator 130.

Figure 5:
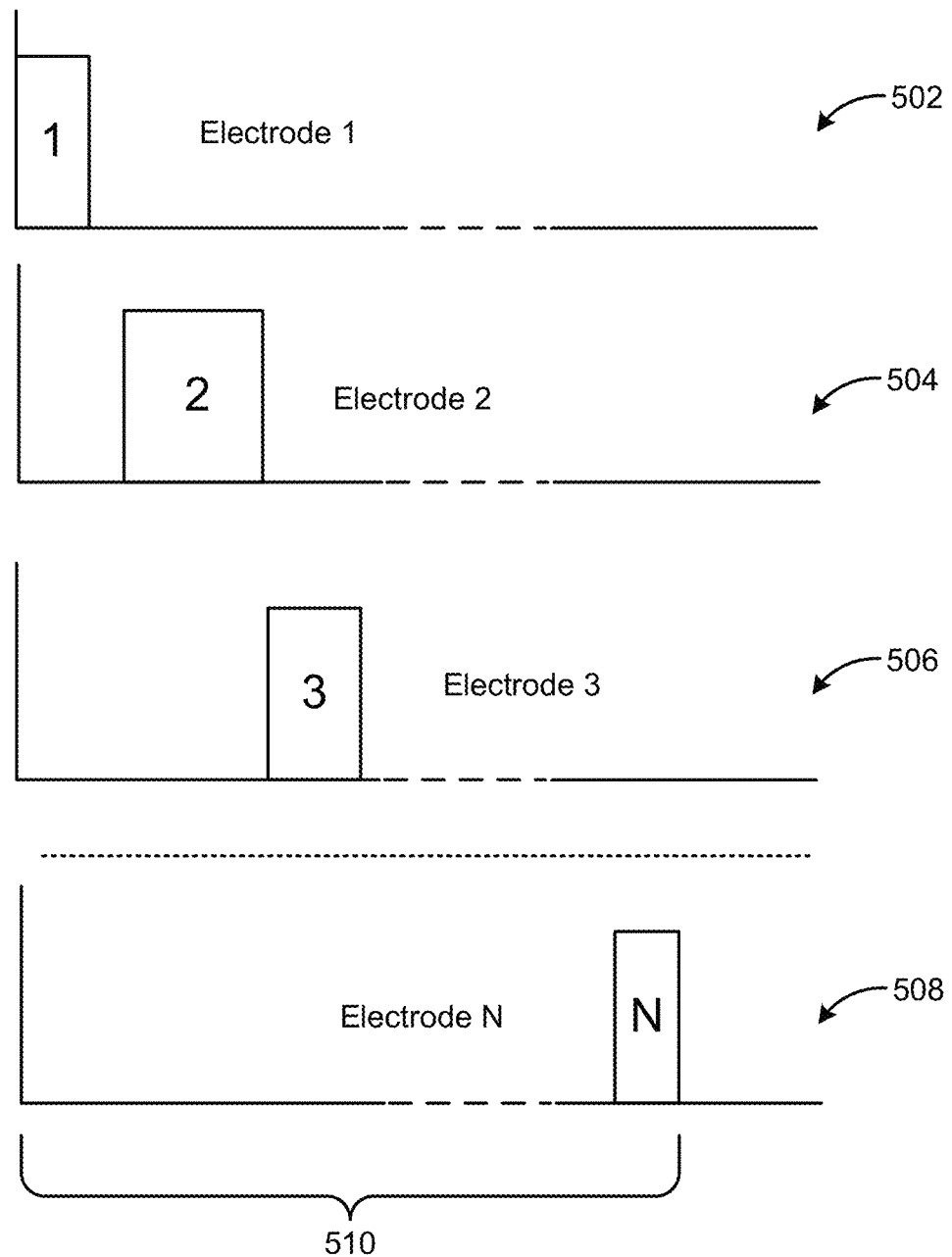
FIG. 5 is a schematic diagram illustrating one embodiment of a process for RF power distribution in a multi-zone electrode array.

FIG. 5 is a schematic diagram illustrating one embodiment of a process for RF power distribution in a multi-zone electrode array. Elements referenced in the discussion for FIG. 5 will include elements shown in previously discussed figures. In an embodiment, at a first time 502, a first switch 206a may be engaged to supply high frequency (HF) power to a first electrode 216a of the power source 216 in the first electrode assembly 210. The timing and duration of the power applied may be determined by the duty cycle control unit 410 of the source controller 155.

At a second time period 504, power may be applied to the second electrode 216b for a second duration. At a third time period 506, power may be applied to the third electrode 216c for a third duration. At a fourth time period 508, power may be applied to an $n^{th}$ electrode (not shown) for an $n^{th}$ duration. Accordingly, duty may be applied to each electrode within one power cycle (T) 510, and power cycle may loop continuously during operation. In an embodiment, the duty cycle is in a range from 0.1 ms to 10 s.

Figure 6:
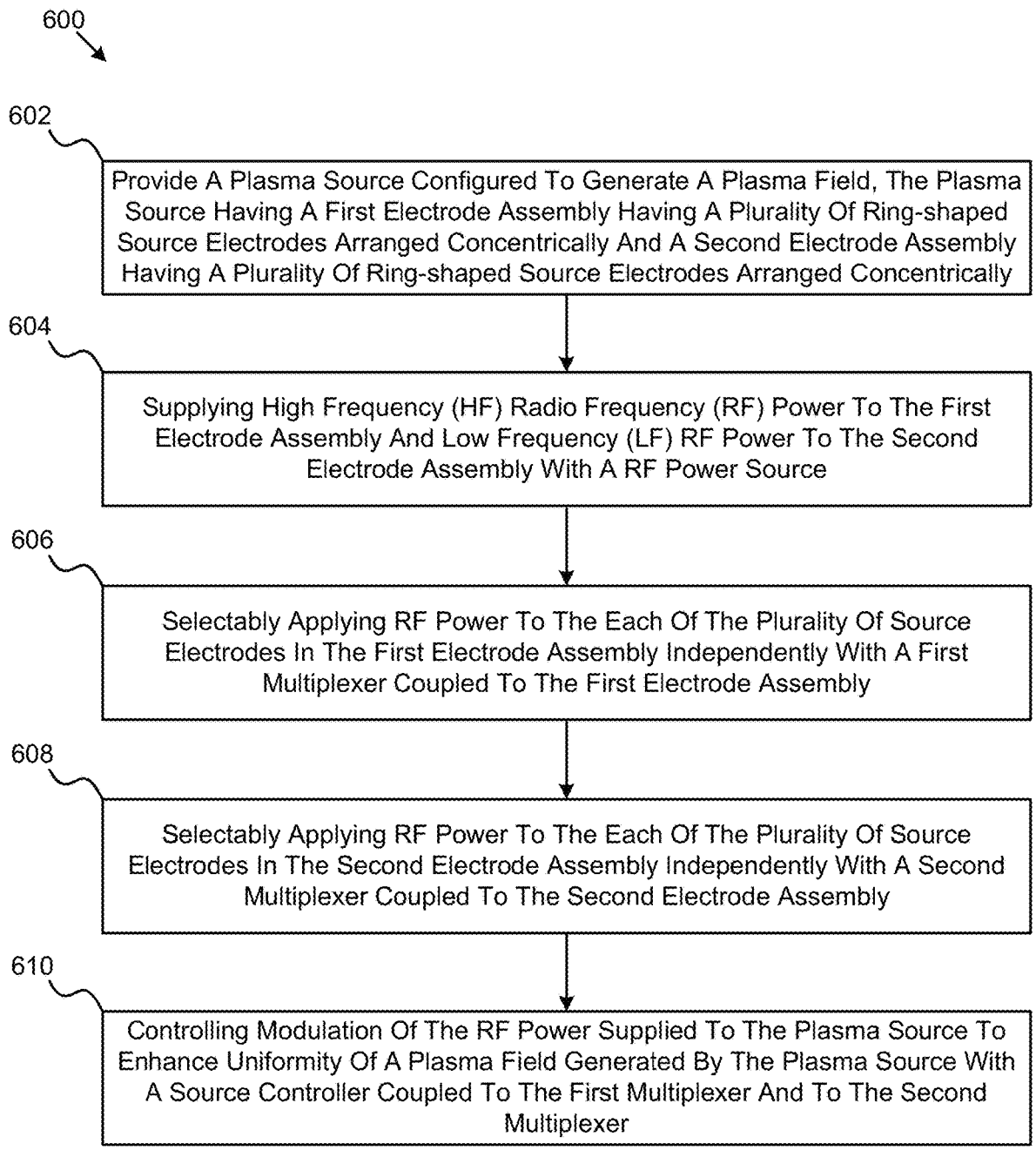
FIG. 6 is a flowchart diagram illustrating one embodiment of a method for RF power distribution in a multi-zone electrode array.

FIG. 6 is a flowchart diagram illustrating one embodiment of a method 600 for RF power distribution in a multi-zone electrode array. In an embodiment, the method 600 includes providing a plasma source configured to generate a plasma field, the plasma source having a first electrode assembly having a plurality of ring-shaped source electrodes arranged concentrically and a second electrode assembly having a plurality of ring-shaped source electrodes arranged concentrically, as shown at block 602. As mentioned above, other configurations of the arrangements of the source electrodes can also be used. At block 604, the method 600 includes supplying High Frequency (HF) Radio Frequency (RF) power to the first electrode assembly and Low Frequency (LF) RF power to the second electrode assembly with a RF power source. At block 606, the method 600 includes selectably applying RF power to the each of the plurality of source electrodes in the first electrode assembly independently with a first multiplexer coupled to the first electrode assembly. The method 600 may also include selectably applying RF power to the each of the plurality of source electrodes in the second electrode assembly independently with a second multiplexer coupled to the second electrode assembly, as shown at block 608. At block 610, the method 600 includes controlling modulation of the RF power supplied to the plasma source to enhance uniformity of a plasma field generated by the plasma source with a source controller coupled to the first multiplexer and to the second multiplexer.

Beneficially, the present embodiments may enhance process flexibility by providing multiple combinations of RF pulsing frequencies and patterns. For example, temporal pulse patterns may be varied to provide a greater or lesser time average ion bombardment distribution. Indeed, various embodiments described herein provide time averaged ion bombardment distribution control over the wafer. Additionally, special plasma density distribution control may be achieved. For example, the multi-zone electrode array may provide enhanced special plasma density distribution control. Such embodiments may also compensate for standing wave effects at high frequencies. A further benefit is that the present embodiments may achieve these benefits, and still only require a single RF source 172 per electrode assembly, which is already included in most standard process tools.

One of ordinary skill will appreciate that the described embodiments may enhance process flexibility by providing multiple combinations of pseudo CW and RF pulsing capabilities. Additionally, the described embodiments may enhance spatial plasma density distribution control. Time-average ion bombardment distribution control over the substrate may also be enhanced. Such embodiments may potentially compensate standing wave effects at high frequencies. Additionally, such embodiments still only require a single RF generator per electrode assembly, as is implemented in most standard process tools. Thus, hardware modifications or addition requirements may be limited.

Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What we claim:

1. A system for plasma processing, comprising:
   a plasma source including a first electrode assembly having a first plurality of source electrodes and a second electrode assembly having a second plurality of source electrodes, the first electrode assembly and the second electrode assembly being in a facing arrangement that defines a processing region between the first electrode assembly and the second electrode assembly, the plasma source being configured to generate a plasma field in the processing region;
   a first multiplexer for selectably applying Radio Frequency (RF) power to the first plurality of source electrodes in the first electrode assembly independently;
   a second multiplexer for selectably applying the RF power to the second plurality of source electrodes in the second electrode assembly independently;
   a first Radio Frequency (RF) power source coupled to the first electrode assembly via the first multiplexer and a second Radio Frequency (RF) power source coupled to the second electrode assembly via the second multiplexer and configured to supply the RF power to the plasma source; and
   a source controller coupled to the first and second RF power sources, the first multiplexer, and the second multiplexer, and configured to control modulation of the RF power supplied to the plasma source to enhance uniformity of the plasma field generated by the plasma source by selectably applying the RF power to each of the plurality of source electrodes in at least one of the first electrode assembly and the second electrode assembly in series.

2. The system of claim 1, wherein the number of source electrodes in the first electrode assembly is in a range of 2 to 100.

3. The system of claim 1, wherein the first multiplexer comprises a switch for selectably applying the RF power to each of the plurality of source electrodes in the first electrode assembly independently.

4. The system of claim 1, wherein the number of source electrodes in the second electrode assembly is in a range of 2 to 100.

5. The system of claim 1, wherein the first RF power source is configured to apply High Frequency (HF) power to the plasma source.

6. The system of claim 1, wherein the second RF power source is configured to apply Low Frequency (LF) power to the plasma source.

7. The system of claim 1, wherein at least one of first and second RF power sources a configured to apply mixed-frequency power to the plasma source.

8. The system of claim 1, wherein at least one of first and second RF power sources is configured to apply non-sinusoidal power to the plasma source, wherein at least one of the magnitude and period of the power is variable with time.

9. The system of claim 1, wherein the source controller is configured to modulate frequency of RF power supplied to at least one of the first and second RF power sources within a specified time period, and wherein the frequency of the RF power supplied is in a range from 1 Hertz to 200 MegaHertz.

10. The system of claim 1, wherein the source controller is configured to modulate a duty cycle of power supplied to at least one of the first and second RF power sources, and wherein a cycle time of the modulated duty cycle is in a range of 0.1 milliseconds to 10 seconds.

11. The system of claim 1, wherein the source controller is configured to cause at least one of the first and second RF powers sources to supply a pseudo-Continuous Wave (CW) power to the plasma source.

12. The system of claim 1, wherein the source controller is configured to cause at least one of the first and second RF power sources to supply RF power pulses to the plasma source.

13. The system of claim 1, wherein the source controller is configured to cause at least one of the first and second RF power sources to supply a combination of pseudo-Continuous Wave (CW) power and RF power pulses to the plasma source.

14. The system of claim 1, wherein the plasma source comprises a plurality of ring-shaped source electrodes arranged concentrically or an array of patch electrodes or an array of strip electrodes.

* * * * *